United States Patent
Jeong et al.

(10) Patent No.: US 7,655,951 B2
(45) Date of Patent: Feb. 2, 2010

(54) THIN FILM TRANSISTOR AND THE MANUFACTURING METHOD THEREOF

(75) Inventors: Jae Kyeong Jeong, Yongin (KR); Jae Bon Koo, Yongin (KR); Hyun Soo Shin, Yongin (KR); Yeon Gon Mo, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 229 days.

(21) Appl. No.: 11/433,177

(22) Filed: May 12, 2006

(65) Prior Publication Data

US 2006/0255338 A1 Nov. 16, 2006

(30) Foreign Application Priority Data

May 16, 2005 (KR) .................. 10-2005-0040464

(51) Int. Cl.
*H01L 29/786* (2006.01)
(52) U.S. Cl. .................. 257/66; 257/E29.273
(58) Field of Classification Search ............. 257/57–66, 257/72, 75, E21.411–E21.414, E29.288–E29.292; 438/149–151
See application file for complete search history.

(56) References Cited

U.S. PATENT DOCUMENTS

| | | | | | |
|---|---|---|---|---|---|
| 3,657,613 | A | * | 4/1972 | Brody et al. ............. | 257/66 |
| 5,534,731 | A | * | 7/1996 | Cheung ................. | 257/759 |
| 6,172,721 | B1 | * | 1/2001 | Murade et al. ........... | 349/43 |
| 6,642,092 | B1 | * | 11/2003 | Voutsas et al. .......... | 438/166 |
| 2005/0181566 | A1 | * | 8/2005 | Machida et al. ......... | 438/301 |

FOREIGN PATENT DOCUMENTS

| | | |
|---|---|---|
| JP | 2004-48005 | 2/2004 |
| JP | 2004-214281 | 7/2004 |
| KR | 2003-0070807 | 9/2003 |

OTHER PUBLICATIONS

Theiss et al., "Amorphous Silicon Thin-Film Transistors on Steel Foil Substrates," IEEE Electron Device Letters, vol. 17, No. 12, Dec. 1996 pp. 578-580.*
Patent Abstracts of Japan, Publication No. 2004-048005, dated Feb. 12, 2004, in the name of Masahiro Adachi et al.
Korean Patent Abstracts, Publication No. 1020030070807 A, dated Sep. 2, 2003, in the name of Kim Tamala et al.
Patent Abstracts of Japan, Publication No. 2004-214281; Publication Date: Jul. 29, 2004; in the name of Maruyama et al.

* cited by examiner

*Primary Examiner*—Zandra Smith
*Assistant Examiner*—Paul E Patton
(74) *Attorney, Agent, or Firm*—Christie, Parker & Hale, LLP

(57) ABSTRACT

A thin film transistor and a method for manufacturing the same capable of reducing a change in a threshold voltage of the thin film transistor formed on a flexible substrate. The thin film transistor includes: a substrate, the substrate being flexible; a buffer layer having a low dielectric constant from about 1.2 to about 4.0 and formed on the substrate; a semiconductor layer formed on the buffer layer; a gate electrode; first insulation layer formed between the gate electrode and the semiconductor layer; a second insulation layer formed on the semiconductor layer and the gate electrode; and a source/drain electrode electrically connected to the semiconductor layer through a contact hole formed in the second insulation layer. Therefore, the thin film transistor can reduce a change in its threshold voltage, thereby reducing changes in brightness, gray scale, contrast, etc., of light-emitting devices using the thin film transistor.

14 Claims, 2 Drawing Sheets

THIN FILM TRANSISTOR AND THE MANUFACTURING METHOD THEREOF

CROSS-REFERENCE TO RELATED APPLICATION

This application claims priority to and the benefit of Korean Patent Application No. 10-2005-0040464, filed on May 16, 2005, in the Korean Intellectual Property Office, the entire content of which is incorporated herein by reference.

BACKGROUND

1. Field of the Invention

The present invention relates to a thin film transistor and a method for manufacturing the same, and more particularly to a thin film transistor and a method for manufacturing the same which are capable of reducing a change in a threshold voltage of the thin film transistor by forming a buffer layer with a low dielectric constant.

2. Discussion of Related Art

In general, in order to form a thin film transistor on a flexible substrate, that is, on a metal thin film made of stainless steel, titanium (Ti), etc., an insulation buffer layer must be provided between the metal thin film and the thin film transistor. A thin film transistor having a buffer layer formed on a metal thin film has electrical and structural characteristics similar to a system on insulator (SOI) transistor. In the thin film transistor having the buffer layer form on the metal thin film, a semiconductor layer constituting the thin film transistor is made of low temperature polysilicon (LTPS) obtained by heating and crystallizing an amorphous silicon layer at a low temperature.

In the thin film transistor with the structure described above, that is, in the thin film transistor having the semiconductor layer made of the low temperature polysilicon formed on the metal thin film, a threshold voltage of the thin film transistor can be controlled through a circuit design by effectively utilizing a bias signal (for example, current, voltage, etc.) which is applied to the thin film transistor. In this case, in order to stabilize the operation of the thin film transistor, that is, in order to obtain an optimal result when an arbitrary signal is processed, a direct current (DC) voltage or a predetermined signal can be added to the arbitrary signal to be processed.

However, when a DC voltage or a predetermined signal is applied to the thin film transistor with the structure described above, the threshold voltage of the thin film transistor can be changed. Also, if an unintended voltage is applied to the metal thin film or if unexpected charges are accumulated on the metal thin film due to static electricity, etc., the threshold voltage of the thin film transistor may become different from a reference design value recommended when the thin film transistor is initially designed. Furthermore, if the threshold voltage of the thin film transistor becomes different from the reference design value, color coordinates to be displayed on a screen of a display apparatus utilizing the thin film transistor are changed, and accordingly gray scale and contrast are also changed.

Therefore, in order to solve the above-described problems, the present invention provides a thin film transistor and a method for manufacturing the same which are capable of significantly reducing an electrical characteristic change of the thin film transistor, by in advance preventing an electrical characteristic change (for example, a change in a threshold voltage) of the thin film transistor from occurring when an unintended voltage is temporarily or momentarily applied to the thin film transistor.

SUMMARY OF THE INVENTION

According to an embodiment of the present invention, there is provided a thin film transistor including: a substrate, the substrate being flexible; a buffer layer having a low dielectric constant from about 1.2 to 4.0 and formed on the substrate; a semiconductor layer formed on the buffer layer; a gate electrode; a first insulation layer formed between the gate electrode and the semiconductor layer; a second insulation layer formed on the semiconductor layer and the gate electrode; and a source/drain electrode electrically connected to the semiconductor layer through a contact hole formed in the second insulation layer.

In one embodiment, the low dielectric constant is greater than 1.2 and less than 3, and/or the buffer layer includes SiOC, Xerogels (nanoporous dielectric), Silsesquioxanes (SOG), and/or SiOF. The buffer layer has a thickness between about 0.3 and 10 μm. Also, the thin film transistor further includes a diffusion prevention layer formed between the substrate and the buffer layer. The diffusion prevention layer includes tin (Sn).

The thin film transistor further includes a third insulation layer formed on the substrate, the substrate being between the third insulation layer and buffer layer, and/or the third insulation layer includes $SiO_2$ and/or $SiN_x$. The substrate includes a metal thin film. The metal thin film includes stainless steel (sus) and/or titanium (Ti).

According to another embodiment of the present invention, there is provided a method for manufacturing a thin film transistor, the method including: forming a buffer layer having a low dielectric constant between about 1.2 to 4.0 on a substrate, the substrate being flexible; forming a semiconductor layer on the buffer layer; forming a first insulation layer on the semiconductor layer; applying a metal layer on the first insulation layer to form a gate electrode; forming a second insulation layer on the semiconductor layer and the gate electrode; and electrically connecting a source/drain electrode to the semiconductor layer through a contact hole formed in the second insulation layer.

In one embodiment, the thin film transistor manufacturing method further includes forming a diffusion prevention layer between the substrate and the semiconductor layer. The thin film transistor manufacturing method further includes simultaneously patterning the first insulation layer and the metal layer formed on the first insulation layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 1:
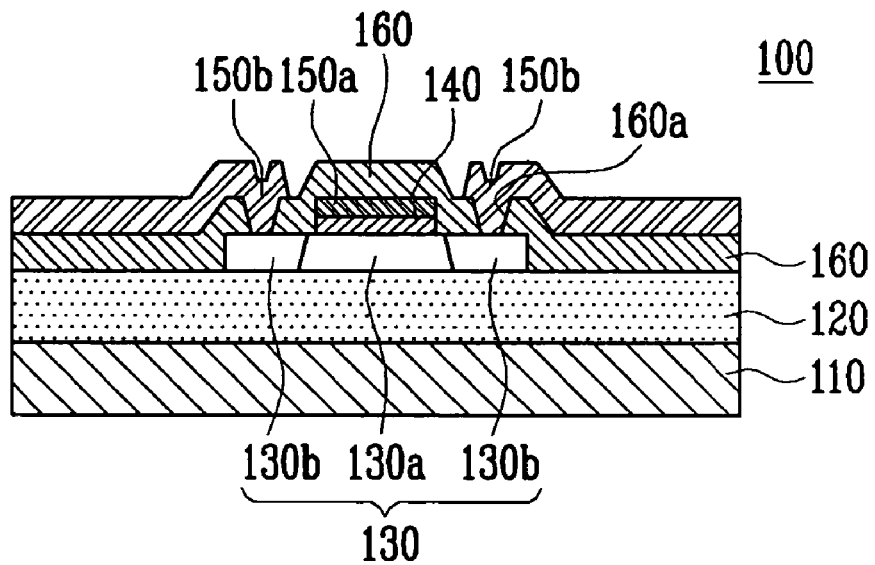
FIG. 1 is a cross-sectional view of a thin film transistor according to a first embodiment of the present invention.

FIG. 1 is a cross-sectional view of a thin film transistor 100 according to a first embodiment of the present invention. Referring to FIG. 1, the thin film transistor 100 includes a substrate 110, a buffer layer 120, a semiconductor layer 130, a first insulation film 140, a gate electrode 150a, a second insulation film 160, and a source/drain electrode 150b.

In more detail, the buffer layer 120 is formed on the substrate 110, the semiconductor layer 130 is formed on the buffer layer 120, the first insulation film 140 is formed on the semiconductor layer 130, and the gate electrode 150a is formed on the first insulation film 140. The second insulation film 160 is formed on the semiconductor layer 130 and the gate electrode 150a, and the source/drain electrode 150b is formed on the second insulation film 160, wherein the source/drain electrode 150b is electrically connected to the semiconductor layer 130 through contact holes 160a formed in the second insulation film 160.

Hereinafter, components constituting the thin film transistor 100 and the order in which the components are formed will be described in more detail with reference to FIG. 1. First, the substrate 110 (hereinafter, referred to as a metal thin film 110), which is a flexible substrate, is formed using a metal layer to have a predetermined thickness. Here, the metal thin film 110 is made of stainless steel (steel special use stainless (sus)), titanium (Ti), etc. In the above-described structure having the substrate 110 formed as the metal thin film, in order to minimize the amount of charges induced in a channel area 130a of the semiconductor layer 130 when a bias signal is applied to the substrate 110, the charging capacity of the buffer layer 120 formed between the semiconductor layer 130 and the metal thin film 110 should be minimized.

In more detail, to reduce the amount of charges charged in the buffer layer 120 by the bias signal applied to the metal thin film 110, the buffer layer 120 formed on the substrate 110 is made of a material with a relatively low dielectric constant (i.e., lower than a dielectric constant of a conventional buffer layer). In one embodiment, the buffer layer 120 is made of a material with a dielectric constant that is between 1.2 and 4 (or greater than 1.2 but less than 3).

In the present embodiment, the buffer layer 120 is formed with a low dielectric constant material, such as SiOC, Xerogels (nanoporous dielectric), Silsesquioxanes (SOG), SiOF and so on. Here, the buffer layer 120 is applied with a predetermined thickness between about 0.3 μm and about 10 μm (in one embodiment, between 0.5 and 5 μm) on the metal thin film 110.

The semiconductor layer 130, which is made of an applied amorphous silicon layer (not shown) transmuted into a polysilicon layer through one of various crystallization methods, is formed on the buffer layer 120. In order to transmute the amorphous silicon layer into the polysilicon layer, an excimer laser method, etc., can be used. In this case, a low temperature polysilicon (LTPS) layer is formed. In more detail, the semiconductor layer 130 is formed by patterning a polysilicon layer formed by a crystallization process. The formed semiconductor layer 130 includes a channel area 130a and a source/drain area 130b.

The first insulation film 140 is formed on the semiconductor layer 130, and the gate electrode 150a is formed by applying a metal layer on the first insulation film 140 and then patterning the metal layer. At this time, the first insulation film 140 and the metal layer forming the gate electrode 150a can be individually patterned according to the order in which they are stacked, or can be simultaneously patterned. After the gate electrode 150a is formed, the second insulation film 160 is formed on the entire surfaces of the buffer layer 120, the semiconductor layer 130, and the gate electrode 150a. The second insulation film 160 is made of $SiO_2$, $SiN_x$, etc. A plurality of contact holes 160a for exposing the semiconductor layer 130 are formed in the second insulation film 160, and the source/drain electrode 150b is formed on the second insulation film 160 in which the contact holes 160a are formed so that the source/drain electrode 150b is electrically connected to the semiconductor layer 130.

As described above in the first embodiment, when a voltage is applied to the metal thin film 110 made of stainless steel (sus), titanium (Ti), etc., a charging capacity between the metal thin film 110 and the semiconductor layer 130 can be minimized by the buffer layer 120 formed with a low dielectric constant material. Accordingly, an electrical characteristic change of the thin film transistor 100 can be minimized.

Figure 2:
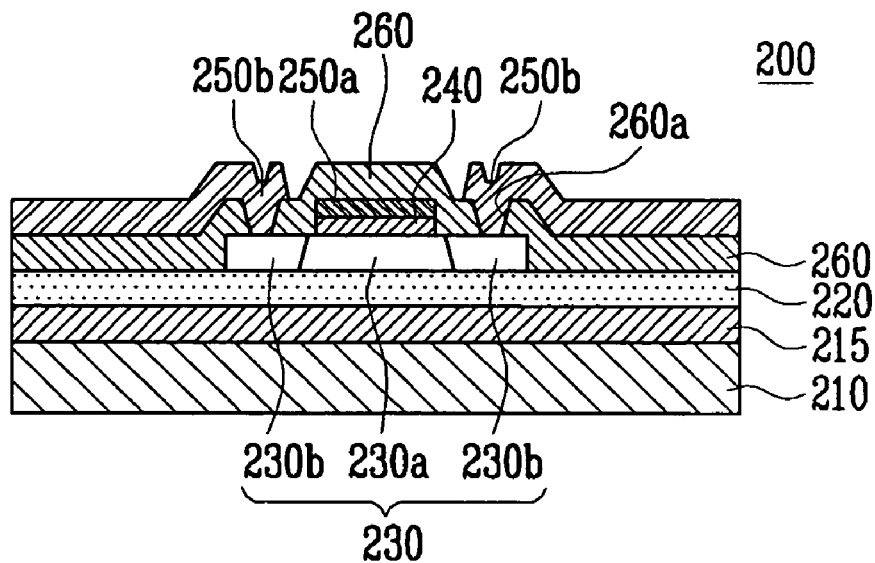
FIG. 2 is a cross-sectional view of a thin film transistor according to a second embodiment of the present invention.

FIG. 2 is a cross-sectional view of a thin film transistor 200 according to a second embodiment of the present invention. In order to avoid repeating the same descriptions, detailed descriptions for structures (or components) that are substantially the same as those of the first embodiment shown in FIG. 1 are not provided again.

Referring to FIG. 2, a diffusion prevention layer 215 is formed on a substrate 210 of the thin film transistor 200 according to the second embodiment of the present invention, and a buffer layer 220 is formed on the diffusion prevention layer 215. A semiconductor layer 230 is formed on the buffer layer 220, a first insulation film 240 and a gate electrode 250a are formed on the semiconductor layer 230, and a second insulation film 260, in which a plurality of contact holes 260a are formed, is formed on the gate electrode 250a and the semiconductor layer 230. A source/drain electrode 250b, which is electrically connected to the semiconductor layer 230 through the contact holes 260a, is formed on the second insulation film 260.

In the second embodiment of the present invention, the substrate 210 is formed as a metal thin film made of stainless steel, titanium (Ti), etc. In addition, the buffer layer 220 can be formed with a thickness between about 0.3 μm and about 10 μm, and, in one embodiment, between 0.5 and 5 μm, using a dielectric material with a low dielectric constant. In one embodiment, the buffer layer 220 is made of a dielectric material with a dielectric constant that is between 1.2 and 4, such as SiOC, Xerogels (nanoporous dielectric), Silsesquioxanes (SOG), SiOF and so on.

Also, in the second embodiment, the diffusion prevention layer 215 is formed between the substrate 210 and the buffer layer 220. The diffusion prevention layer 215 is provided to block impurities from being diffused into different layers of the thin film transistor 200 when an amorphous silicon layer (not shown) formed on the substrate 210 is transmuted into a polysilicon layer using one of various crystallization methods, for example, an excimer laser method. Further, the diffusion prevention layer 215 prevents external impurities from flowing into the buffer layer 220 or the semiconductor layer 230 through the substrate 210. Here, the diffusion prevention layer 215 can be formed with a material such as tin (Sn) and so on.

Figure 3:
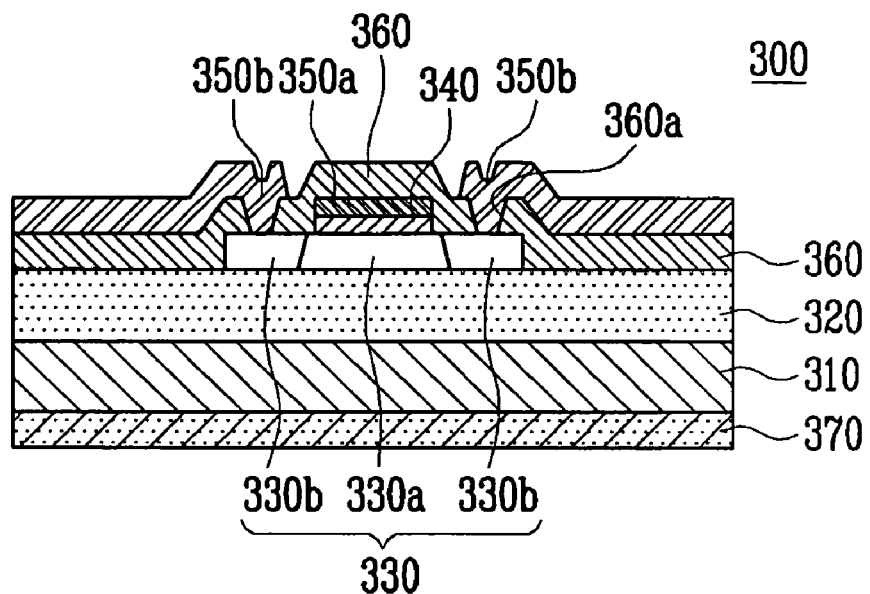
FIG. 3 is a cross-sectional view of a thin film transistor according to a third embodiment of the present invention.

FIG. 3 is a cross-sectional view of a thin film transistor 300 according to a third embodiment of the present invention. For the thin film transistor 300, detailed descriptions for the structures (or components) that are substantially the same as those disclosed in the first and second embodiments of FIGS. 1 and 2 are not provided again.

Referring to FIG. 3, the thin film transistor 300 includes a substrate 310, a buffer layer 320, a semiconductor layer 330, a first insulation film 340, a gate electrode 350a, a second insulation film 360, a source/drain electrode 350b, and a third insulation film 370 formed on the lower surface of the substrate 310.

In the third embodiment, the substrate 310 is formed as a flexible metal thin film made of stainless steel, titanium (Ti), etc. In addition, the buffer layer 320 can be formed with a predetermined thickness between 0.3 and 10 μm (or between 0.5 and 5 μm) using a material with a low dielectric constant. In one embodiment, the buffer layer 320 is made of a material with a dielectric constant that is between 1.2 and 4, for example, SiOC, SiOF, Xerogels (nanoporous dielectric), Silsesquioxanes (SOG), etc.

Specifically, in the third embodiment, the third insulation film 370 is formed on the lower surface of the substrate 310. The third insulation film 370 is made of $SiO_2$, $SiN_x$, etc., and is used to block an unexpected external voltage, external noise, etc., from being applied to the lower surface of the substrate 310 which is a metal thin film.

Figure 4:
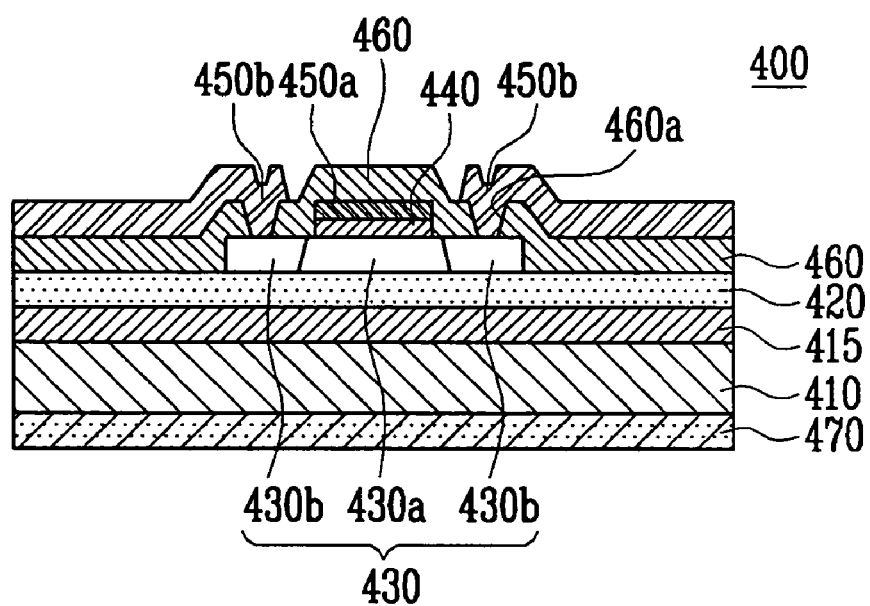
FIG. 4 is a cross-sectional view of a thin film transistor according to a fourth embodiment of the present invention.

FIG. 4 is a cross-sectional view of a thin film transistor 400 according to a fourth embodiment of the present invention. In order to avoid repeating the same descriptions, detailed descriptions for the same structures (or components) that are substantially the same as those disclosed in the first through third embodiments of FIGS. 1 through 3 are not provided again.

Referring to FIG. 4, the thin film transistor 400 includes a substrate 410, a diffusion prevention layer 415 formed on the substrate 410, a buffer layer 420 formed on the diffusion prevention layer 415, a semiconductor layer 430 formed on the buffer layer 420, a first insulation film 440 formed on the semiconductor layer 430, a gate electrode 450a formed on the first insulation film 440, a second insulation film 460 formed on the gate electrode 450a and the semiconductor layer 430, a source/drain electrode 460b electrically connected to the semiconductor layer 430 through contact holes 460a formed in the second insulation film 460, and a third insulation film 470 formed on the lower surface of the substrate 410.

In the fourth embodiment, the substrate 410 is formed as a flexible metal thin film, and, specifically, is made of stainless steel, titanium (Ti), etc. The buffer layer 420 is applied on the substrate 410, using a material with a relatively low dielectric constant (low-k). In one embodiment, the buffer layer 420 is made of a material with a dielectric constant that is between 1.2 and 4, such as SiOC, SiOF, Xerogels (nanoporous dielectric), Silsesquioxanes (SOG) and so on. The buffer layer 420 can be formed with a predetermined thickness between 0.3 and 10 μm. Similar to the above-described first through third embodiments, the reason for forming the buffer layer 420 with a low dielectric constant material is to suppress charges that are charged in the buffer layer 420 through the substrate 410 due to static electricity, etc., and to minimize the amount of charges which may be charged in the substrate 410.

Also, the diffusion prevention layer 415 is formed between the substrate 410 and the buffer layer 420. The diffusion prevention layer 415 is provided to block impurities from being diffused into the substrate 410, and/or to prevent external impurities from inflowing into the buffer layer 420 or the semiconductor layer 430 through the metal thin film 410, when an amorphous silicon layer is crystallized into a polysilicon layer to form the semiconductor layer 430. The diffusion prevention layer 415 is formed with tin (Sn), etc. The third insulation film 470 is formed on the lower surface of the substrate 410, using $SiO_2$, $SiN_x$, etc. The third insulation film 470 is provided to block in advance an unintended external voltage, external noise, etc., from inflowing into the lower surface of the substrate 410 which is formed as a metal thin film.

As described above in the second through fourth embodiments, even when an unintended external voltage, external noise, etc., are applied to a substrate which is formed as a metal thin film made of stainless steel, etc., a charging capacity between the metal thin film and a semiconductor layer can be minimized due to a buffer layer with a low dielectric constant formed between the metal thin film and the semiconductor layer. Also, due to a diffusion prevention layer and/or a third insulation film formed on the substrate, it is possible in advance to block external noise, impurities, etc., from inflowing into main components of a thin film transistor including a semiconductor layer.

In the first through fourth embodiments described above, by forming a buffer layer with a low dielectric constant between a metal thin film and a semiconductor layer, a charging capacity between the metal thin film and the semiconductor layer is limited. Along with this, the charging capacity can be further limited by adjusting the thickness of the buffer layer.

As described above, according to the present invention, by in advance blocking an electrical characteristic change (for example, a change in a threshold voltage) of a thin film transistor from occurring when an unintended external voltage is temporarily or momentarily applied, the electrical characteristic change of the thin film transistor can be significantly reduced.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A thin film transistor comprising:
   a substrate, the substrate being flexible;
   a buffer layer having a low dielectric constant from about 1.2 to about 4.0 and on the substrate;
   a semiconductor layer on the buffer layer;
   a gate electrode;
   a first insulation layer between the gate electrode and the semiconductor layer;
   a second insulation layer on the semiconductor layer and the gate electrode; and
   a source/drain electrode electrically connected to the semiconductor layer through a contact hole in the second insulation layer, and
   a third insulation layer on the substrate, the substrate being between the third insulation layer and the buffer layer.

2. The thin film transistor of claim 1, wherein the low dielectric constant is greater than 1.2 and less than 3.

3. The thin film transistor of claim 1, wherein the buffer layer comprises a thickness between about 0.3 and 10 μm.

4. The thin film transistor of claim 1, wherein the substrate comprises a metal thin film.

5. The thin film transistor of claim 4, wherein the metal thin film comprises stainless steel (sus) and/or titanium (Ti).

6. The thin film transistor of claim 4, further comprising:
   a diffusion prevention layer between the substrate and the buffer layer.

7. The thin film transistor of claim 6, wherein the diffusion prevention layer comprises tin (Sn).

8. The thin film transistor of claim 1 wherein the third insulation layer comprises $SiO_2$ and/or $Sin_x$.

9. A thin film transistor comprising:
a flexible substrate;
a buffer layer formed on the flexible substrate;
a semiconductor layer formed on the buffer layer;
a gate electrode;
a first insulation layer formed between the gate electrode and the semiconductor layer;
a second insulation layer formed on the semiconductor layer and the gate electrode;
a source/drain electrode electrically connected to the semiconductor layer through a contact hole in the second insulation layer; and
a separate diffusion prevention layer formed between the substrate and the buffer layer.

10. A thin film transistor comprising:
a flexible substrate;
a buffer layer on the flexible substrate;
a semiconductor layer on the buffer layer;
a gate electrode;
a first insulation layer between the gate electrode and the semiconductor layer;
a second insulation layer on the semiconductor layer and the gate electrode;
a source/drain electrode electrically connected to the semiconductor layer through a contact hole in the second insulation layer; and
a third insulation layer on the substrate and adapted to block an external noise, the substrate being between the third insulation layer and buffer layer.

11. The thin film transistor of claim 10, further comprising:
a diffusion prevention layer between the substrate and the buffer layer.

12. The thin film transistor of claim 1, wherein the buffer layer comprises Xerogels (nanoporous dielectric), Silsesquioxanes (SOG), SiOC, and/or SiOF.

13. The thin film transistor of claim 1, wherein the second insulation layer is directly on the semiconductor layer and the gate electrode.

14. The thin film transistor of claim 1 further comprising a separate diffusion prevention layer between the substrate and the buffer layer.

* * * * *

UNITED STATES PATENT AND TRADEMARK OFFICE
CERTIFICATE OF CORRECTION

PATENT NO. : 7,655,951 B2  
APPLICATION NO. : 11/433177  
DATED : February 2, 2010  
INVENTOR(S) : Jae Kyeong Jeong et al.

Page 1 of 1

It is certified that error appears in the above-identified patent and that said Letters Patent is hereby corrected as shown below:

In the Claims

Column 6, Claim 8, line 67          Delete "$Sin_x$,"  
                                            Insert -- $SiN_x$ --

Column 7, Claim 9, lines 3, 4, 6, 8 and 13      Delete "formed"

Signed and Sealed this  
Ninth Day of August, 2011

David J. Kappos  
*Director of the United States Patent and Trademark Office*